(12) United States Patent
Miller et al.

(10) Patent No.: US 6,305,180 B1
(45) Date of Patent: Oct. 23, 2001

(54) COOLING SYSTEM FOR USE IN COOLING ELECTRONIC EQUIPMENT

(75) Inventors: David Jonathan Miller, Teddington; Ian James Sams, Great Tey; Michael James Holland; Simon David Fields, both of Thetford, all of (GB)

(73) Assignees: British Broadcasting Corporation, London; Troy (UK) Limited, Norfolk, both of (GB)

( * ) Notice: Subject to any disclaimer, the term of this patent is extended or adjusted under 35 U.S.C. 154(b) by 0 days.

(21) Appl. No.: 09/659,906

(22) Filed: Sep. 12, 2000

(30) Foreign Application Priority Data

Sep. 13, 1999 (GB) .................................................... 9921594

(51) Int. Cl.[7] .................................................... F25D 23/12
(52) U.S. Cl. ...................... 62/259.2; 62/267; 165/104.33; 361/701
(58) Field of Search ............................... 62/259.2, 259.1, 62/267, 441, 440; 165/80.3, 104.33; 361/701

(56) References Cited

U.S. PATENT DOCUMENTS

| | | | |
|---|---|---|---|
| 3,317,798 | * 5/1967 | Cchu et al. ............................ | 317/100 |
| 3,754,596 | * 8/1973 | Ward, Jr. ............................... | 165/107 |
| 4,315,300 | * 2/1982 | Parmerlee et al. .................... | 361/382 |
| 4,514,746 | * 4/1985 | Lundqvist ............................. | 361/385 |
| 5,016,138 | 5/1991 | Woodman . | |
| 5,196,989 | * 3/1993 | Zsolnay ................................. | 361/383 |
| 5,835,349 | 11/1998 | Giannatto et al. . | |
| 5,880,931 | * 3/1999 | Tilton et al. .......................... | 361/690 |
| 6,026,565 | * 2/2000 | Giannatto et al. ..................... | 29/830 |
| 6,175,498 | * 1/2001 | Conroy et al. ........................ | 361/704 |

FOREIGN PATENT DOCUMENTS 2 113 012    7/1983   (GB) .

* cited by examiner

*Primary Examiner*—William Doerrler
*Assistant Examiner*—Melvin Jones
(74) *Attorney, Agent, or Firm*—Herbert Dubno

(57) ABSTRACT

A system for cooling electronic equipment, especially modular electronic units mounted in racks, each having a casing with an air inlet, an air outlet and a fan for cooling the contents of the unit. The system uses a chiller unit, between adjacent racks for returning cooled air to ambient, each of which can be a piping array connected to a supply of chilled water. A baffle backing the piping array improves heat exchange and provides a more uniform transfer of heat to each array, thereby enabling optimum temperature differences to be achieved across each rack. A slidable framework supports the piping array and defines an air space on the cooled air side of the array. An auxiliary piping array extends rearwardly of racks so as to communicate with rear air spaces behind the racks and thereby cool heated air flowing in the rear air spaces. An auxiliary heat extraction device, operated by an independent electrical generator, includes a temperature sensor located in a return pipe of the piping array, and a switch responsive to an output from the sensor for starting the generator in order to extract heat from the coolant if the return coolant temperature falls below a predetermined value due to failure of a power supply driving the main heat extraction device.

28 Claims, 10 Drawing Sheets

FIG. 1e

| Top row | Middle row | Bottom row |
|---|---|---|
| 55.1°C / 49.5°C | 49.5°C / 36.0°C | 36.0°C / 22.2°C |
| 54.1°C / 49.1°C | 49.1°C / 35.8°C | 35.8°C / 22.0°C |
| 52.8°C / 46.9°C | 46.9°C / 35.5°C | 35.5°C / 21.3°C |
| 51.0°C / 46.2°C | 46.2°C / 34.0°C | 34.0°C / 20.3°C |
| 49.1°C / 43.8°C | 43.8°C / 33.3°C | 33.3°C / 19.7°C |
| 49.6°C / 43.1°C | 43.1°C / 35.0°C | 35.0°C / 19.5°C |
| 46.8°C / 40.5°C | 40.5°C / 31.8°C | 31.8°C / 19.0°C |
| 44.2°C / 39.0°C | 39.0°C / 31.1°C | 31.1°C / 18.3°C |
| 41.0°C / 36.8°C | 36.8°C / 28.8°C | 28.8°C / 17.5°C |
| 34.3°C / 31.1°C | 31.1°C / 26.0°C | 26.0°C / 16.6°C |

FIG. 6
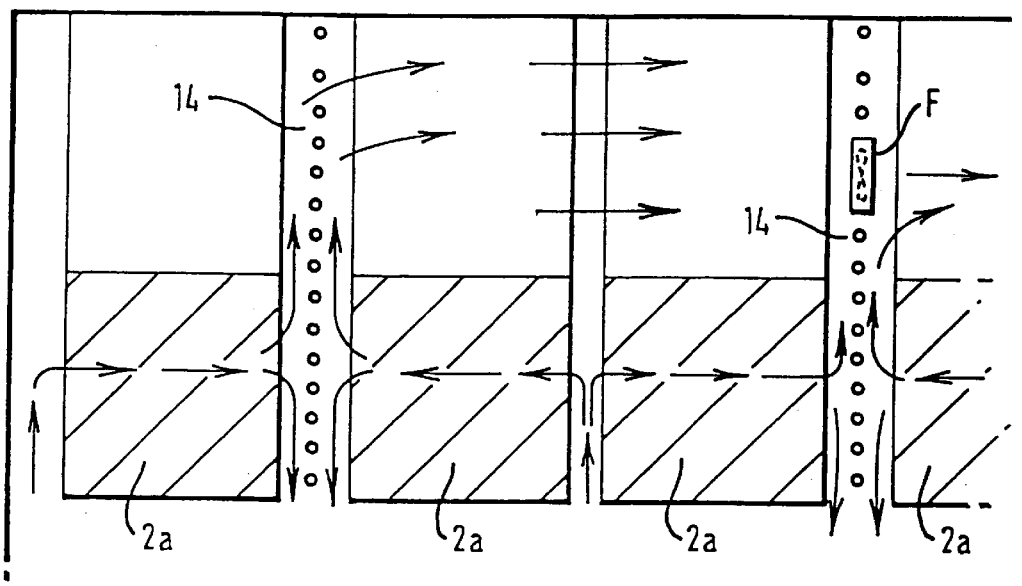
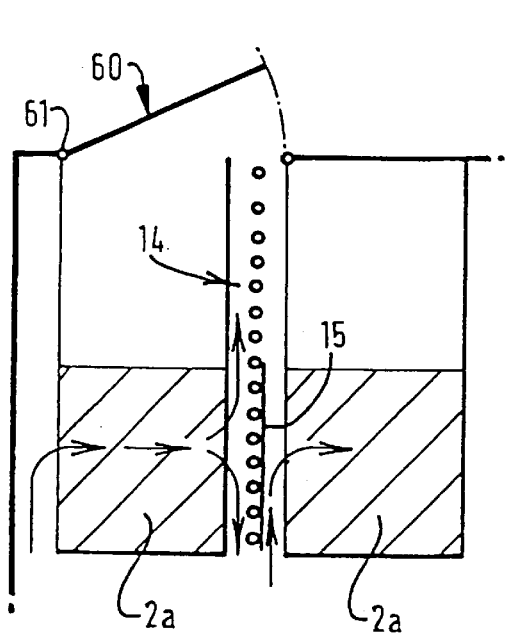
FIG. 7a
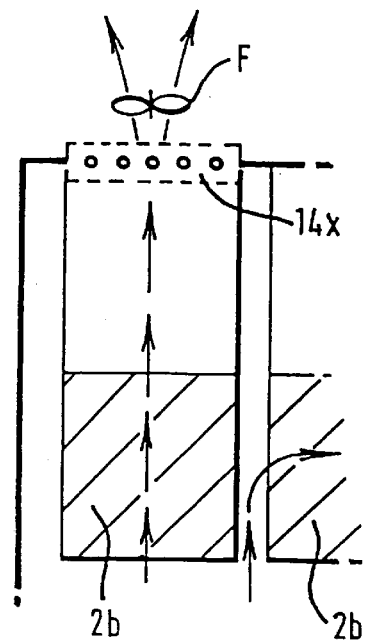
FIG. 7b

COOLING SYSTEM FOR USE IN COOLING ELECTRONIC EQUIPMENT

This invention relates to a cooling system for use in cooling electronic equipment which includes electronic units mounted in racks. Such units typically have a ventilated casing and a fan for cooling the components in the casing, but when several units are stacked closely on racks, the usual ventilation is not effective and some units can become overheated and fail. The invention is directed to dealing with this problem.

In the past, analogs electronic circuitry was more openly constructed so that it could be cooled when forced air was supplied to the room in which it was installed. Therefore, when such analog equipment was installed on racks, it could be cooled by cooling air in the room in which the rack or racks were installed. However, with the trend towards greater u se of digital equipment, digital electronic circuitry is often now housed in units of a modular construction, each of which usually includes a casing of a modular size (such as 600mm.×500 mm), designed to fit into a corresponding space in a rack, the rack housing a column of such electronic units, mounted one above the other, and several racks being positioned side by side in a room which is normally temperature controlled. The electronic units and racks are designed as neat columns and rows, so that the front panels are flush with one another. Whilst this provides a more aesthetic appearance, at least some of the electronic units are then susceptible to overheating, as will be explained in more detail below.

Generally speaking, in dividual electronic units contain components which generate heat when the unit is supplied with electrical power. However, such electronic units are adapted to be cooled and maintained at a safe operating temperature by "on-board" air cooling means including an inlet and outlet in the casing, and an internal fan for inducing a flow of cool ambient air from the inlet to the outlet which flows over the components. Whilst such air cooling means is satisfactory for individual electronic units when located in free air, a problem of overheating can occur when the electronic units are stacked closely together on adjacent racks. This overheating can occur despite gaps between adjacent racks and despite providing a rear air space behind the racks. The rear air space is normally much larger than the intermediate space between the racks, because it accommodates cabling, but these air spaces do not provide a reliable way of cooling rack mounted electronic units (especially digital) since not enough air flow can take place.

The latter problem is aggravated by the increasing number of racks, positioned side by side, in the same room and also by reducing the width of the air gaps between racks (to conserve space). For example, whilst a column of electronic units mounted in a first rack are closest to the incoming ambient "cold" air and can be sufficiently cooled, the air heated by passage through each of these units can rise in temperature by some 5° to 10° C. Whilst this heated air can escape from the air outlets of the electronic units in the first tack into the gap between the racks, if the air inlets of the electronic units in the second adjacent rack are positioned at the same modular height as the air outlets of the electronic units in the first rack, then the fans in the units of the second rack can induce this heated air (rather than colder ambient air from the side air spaces or rear air spaces) which then flows into the downstream units and causes the air temperature to rise. This occurs with electronic units which are positioned at the same modular heights in every pair of adjacent racks, whereby the air temperature rises progressively and cumulatively from one end of the racks to the other. For example, the increase in temperature, from rack to rack, can be sufficient to produce a final exit air temperature in excess of some 50° C. As the electronic units are not intended to work at such a temperature, the life expectancy of overheated electronic units is considerably reduced, for example, sometimes to even just a few weeks. Such overheating clearly cannot be tolerated, not only due to the high cost of replacing expensive electronic units, but also due to the problems of downtime, inconvenience and refitting.

This problem cannot be solved by increasing the air throughput of the internal fans, since the heated air from an outlet of an upstream electronic unit will still be supplied to the air inlet of the adjacent downstream electronic unit and the air gaps between the adjacent racks (and the rear air space) would not allow enough cold ambient air to be drawn into the air inlets of downstream electronic units prevent some from overheating (due to the cumulative rise in temperature).

Attempts to deal with this problem by cooling the air in the room in which the electronic units are installed have not been entirely successful. More effective cooling can be achieved by ducting cold air in channels beneath floor level, and running the channels to rear air spaces behind the electronic units in the racks. However, a rack of say ten electronic units may generate about 1 kilowatt of heat, whereby 10 kilowatts of heat would be produced by the electronic units in 10 adjacent racks. Due to space limitations, only narrow gaps are left between adjacent racks and this creates too much fluidic impedance for efficient cooling by forced chilled air. The rear air space is often comparatively large, but it is obstructed by large amounts of cabling and it is at the rear of the electronic units, not at the sides where there is close proximity between upstream air outlets that face downstream air inlets when modular electronic units are stacked at corresponding heights. Therefore, whilst overheating can be reduced by ducting cold air via floor voids, it has proved to be an unreliable method. Moreover, over-cooling ambient air is inefficient.

A problem facing the invention is not only to cool individual electronic units by a required amount, but also to provide uniform cooling of many electronic units in several adjacent racks. For example, electronic units designed to operate at room temperature may ideally be maintained at a generally uniform ambient temperature within the range of 20° to 24° C. Whilst it may be comparatively simple to maintain racks of upstream electronic units at such a temperature, since they are first in receiving in coming cool air, the problem remains of maintaining a sufficient cooling from rack to rack since downstream electronic units are more susceptible to overheating. Moreover, it is necessary to avoid overcooling of upstream electronic units, since this could give rise to the problems of condensation.

The problem faced by the invention is to provide an inexpensive but efficient method of coolinlg rack mounted electronic units which aims to provide a predetermined and substantially uniform operating temperature for the electronic units in adjacent racks.

The invention solves this problem by providing a cooling system for electronic units mounted in racks, each of said units having a casing with an air inlet, an air outlet and a device for inducing a flow of ambient air from the inlet to the outlet to cool the contents of the electronic unit;

the cooling system comprising at least one chiller unit for location between adjacent upstream and downstream racks, the chiller unit having means for connection to a heat extraction device so that when the chiller unit receives air heated in transit through one or more units in an upstream rack, heat is removed from the air by the chiller unit before it is returned to ambient.

The chiller unit can be constructed in any way which enables the heat to be extracted from a heated air stream and thereby remove heat from the rack mounted electronic equipment. Devices which can achieve this are usually termed "heat sinks". They can include a reservoir of coolants, the reservoir having walls with a large surface area to encourage heat transfer. This surface area can be augmented by fins or equivalent surface formation either attached to or being part of the reservoir walls. These devices may also include some means for causing heated air to flow over most or all of the heat exchanger surface and/or to promote turbulent flow. Whereas the simplest of devices which employ a fluid coolant flow is preferred, this is not essential, since chiller units could be used which employ "evaporation", "change of state", "expansion" or some "electronic effect" to achieve the same purpose.

The chiller unit is preferably a piping array which may be constructed in any convenient way, but it preferably includes a thermally conductive pipe or pipes (e.g. made of copper) which conduct coolant (such as water) on a continuous serpentine path which is arranged, in use, in the space between adjacent racks. The pipe or pipes preferably have fins to increase thermal exchange between the heated air and the coolant. Such fins are made of a good thermal conductor, such as aluminium, and extend transversely, like parallel plates, across the pipes. The coolant is preferably chilled water (but other coolants could be used) which can be conveniently supplied to the piping array by pipework connected to a heat exchanger in a refrigeration system. This latter system may be part of the plant used in a large building, for example, for air conditioning and which is operated by the mains supply in order to chill coolant supplied to air conditioning units. Such a refrigeration system can easily be connected to an additional heat exchanger which then separates coolant used in the cooling system of the invention from coolant circulating in the refrigeration system. Water is preferred as a coolant due to its high heat capacity and because water can be cooled to say about 13° or 14° C. very easily and at very low cost. By arranging the chilled water to flow through the piping array (which forms one coil in a series of similar coils connected in parallel across a coolant inlet and outlet), sufficient heat can be extracted from the warm air which exits the cooling fans of each of the upstream units.

Whilst this inter-rack piping array can be designed to provide a required and predetermined amount of cooling, if the side air outlets from the electronic units in an upstream rack cause heated air to be directed through zones of the pipework immediately opposite the side air inlets of the electronic units in the adjacent downstream rack, some of the piping array may not then receive much (if any) of this heated air. In order to avoid this localised effect, a baffle is preferably included for diverting the heated air stream which exits from the air outlets of the electronic units in the upstream rack, whereby the heated air is distributed more uniformly and turbulently to the pipes in the array. For example, a baffle behind (i.e. downstream from) the piping array prevents the heated air stream, which exits from the side air outlets of the upstream electronic units, from passing directly through the piping array into the side inlets of the downstream electronic units, so that this heated air stream is then diverted across the piping array to be cooled and cooled air then flows to one, or preferably both sides of the array where it escapes into the room and/or into a rear air space behind the electronic units in the rack.

In a preferred embodiment, the baffle is a plate which is arranged after the piping array (with respect to the direction of the heated air stream), and the baffle is flanked by one or more apertured members which allow air that has passed over the piping array to escape at the front or back of the racks. The gap between adjacent racks is wide enough to accommodate the piping array and the baffle whilst also providing side air spaces (a) between the sides of the electronic units in the upstream rack and the piping array, and (b) between the baffle and the sides of the electronic units in the adjacent downstream rack. Although such a baffle is simple in construction, it provides surprisingly good results. For example, a baffle plate which backs most (or substantially all) of the area of the piping array (which area is measured in the vertical plane in the space between adjacent racks) can create a pressure difference across the baffle, so that the air pressure in the air space on the downstream side of the baffle is lower than that on the upstream side of the baffle. Thus, the heated air which is forced across the side air space occupied by the piping array is cooled more efficiently, since there is a greater heat exchange with the coolant, and cooled air then escapes at the front and back whilst ambient cold air enters the other side air space downstream from the baffle and hence the inlets of the units in the downstream racks. Incorporation of these baffles, with rack mounted electronic units having side air inlets and outlets, can be extremely effective in reducing the temperature of the heated air stream, and in maintaining a substantially uniform temperature drop across the electronic units in adjacent racks.

By way of an example only, by suitably designing the piping arrays and the baffle and by controlling the flow of chilled coolant, it was found possible to achieve a steady state where there was a temperature difference of only some 3°–5° across each of several racks (i.e. without any cumulative effect). The flow of coolant water was such that the input (return) coolant water temperature was 14° C., and the output (flow) coolant water temperature was 17° C. In this example, inter-rack piping arrays (coils) were inserted the spaces between three adjacent racks each containing ten units each. The coils were connected in parallel to the coolant flow and return which were part of a coolant loop including a heat exchanger that had sufficient capacity to maintain. a return coolant temperature of 17° C. This result shows a considerable improvement, besides the fact that the system is inexpensive to instal, to operate and to maintain. It therefore solves the cumulative temperature problem because the input air to each unit is effectively at the same chilled temperature.

Whilst specific embodiments of the invention deal mainly with the problem of overheating caused by mounting modular electronic units in racks, where heated air from the outlet of an upstream unit can enter the air inlet of a downstream unit, the invention can be applied more broadly. In the case where electronic units in adjacent racks have fans and vents which cause air to flow in the same direction, from rack to rack, the modular electronic units may be designed in generally the same way. However, when an electronic unit is mounted on the rack, its internal fan and venting may direct air in the opposite direction to that passing through a similar unit on an adjacent rack at the same modular height. In this case, the emerging heated air from adjacent units travels (in opposite directions) into the intermediate space between the adjacent racks. In order to deal with this, a chiller unit can be mounted in the intermediate space and designed and adapted to provide a sufficient heat sink for the heat generated by the adjacent rack mounted units, whereby cooled air is returned to ambient (at the front and the back) at a temperature similar or close to ambient temperature. With such an installation, no baffle may be required, because opposite direct air streams collide and cause much more turbulence and therefore assist with the heat transfer to the intermediate chiller unit. For example, a finned piping array can be provided, without baffles, between such adjacent racks. A installation of this type has intermediate rack spaces which alternately contain a chiller unit and define an air space.

In the case of mounting electronic units in a rack where air flows from the front to the rear, it would also be possible to mount the chiller unit so that it forms the rear wall of the rear air space behind the units in the rack. In this case, ambient air entering the front air inlets passes through the electronic units, then emerges into the rear air space before passing through the chiller unit into the room space.

In order to provide more accessibility and/or adaptability, the racks may have removable panels which, in some cases, could be replaced by chiller units of similar dimensions.

Instead of an installation including modular units which are all of the same design, for example, with side air inlets and outlets and fans directing air in the same direction, some installations need to cope with electronic equipment which, say, is manufactured by different companies and which may therefore include units which induce air flow from left to right, right to left, or front to back (i.e. when the unit is mounted on the rack with its front panel visible). This installation includes a mixture of such units which could, with advantage, be arranged in groups so as to enable the use of intermediate or rear mounted chiller units, as may be required. However, it may include electronic units which cannot be (always) arranged in such similar groups. This problem can be solved by modifying sections of the chiller unit. For example, the bottom three rack mounted units may require an intermediate chiller unit and baffle which deal with heated air flowing in the same direction. The next (upper) three units may have air flowing in opposite directions, where the chiller unit does not require a baffle. The upper four units may be of the front to back air flow type, where the intermediate rack space is just empty. Thus, the invention can be used where the design involves changes at different levels of the racks. This accommodates the effect caused in using different designs of electronic equipment, but in most cases, electronic equipment could be standardised so that hybrid designs can be avoided.

A cooling system which embodies the invention is not only efficient with regard to its cooling effect, but it is also simple to instal. For example, a framework can be provided for supporting the preferred piping array, the framework being dimensioned for insertion between adjacent racks. Whilst this can be made as a fixture, it is preferable to mount the piping array on a framework which is easily removable from the space between adjacent racks, so as to facilitate installation and maintenance. For example, the framework and the floor space on which the framework slides, may include friction reducing means, such as rollers mounted on a track, or slides, or other devices to facilitate insertion and withdrawal of the framework. In a preferred embodiment, adjacent racks are secured together by structural members that define a slot into which the framework (carrying the piping array) is received.

Preferably, the piping array is located so that an air space is provided between the baffle and the opposite sides of the units mounted in an adjacent rack. For example, this air space is substantially rectangular in cross-section, it extends upwardly from the bottom to the top unit in the rack, and it has a width which defines a chamber in which the pressure of air on the downstream side of the baffle is slightly lower than that on the upstream side of the baffle. This chamber provides space for inducing cold air into the air inlets of units in the adjacent rack.

Whilst the electronic units may have side air inlets and outlets, whereby cooling air flows transversely across the contents of the electronic unit to provide cooling, other electronic units may be mounted in the racks which have front and rear air inlets and outlets, and a fan to induce the flow of air from front to back. When using electronic units of the latter kind, (or a mixture of electronic units with side air inlets/outlets and front to back air inlets/outlets) use is also made of a rear airspace at the back of the racks. This rear airspace is normally provided at the rear of the electronic units, for cabling. Whilst this is a large air space, compared with the narrow air space between adjacent racks, additional cooling is then required to maintain an optimum uniform temperature across the installation In order to deal with the latter problem, an auxiliary piping array is provided which extends rearwardly of the racks, so as to communicate with these rear air spaces (behind the racks) and thereby cool heated air flowing in these spaces. This auxiliary piping array may be a part of the piping array which is located between adjacent racks, or it may be additionally provided, depending on specific requirements. When such an auxiliary piping array is employed, additional means for inducing a flow of air (such as fans) are used to promote further cooling. For example, fans mounted on brackets on the upstream (or downstream) side of the auxiliary piping array can be used. The auxiliary piping array may also be mounted on the same framework as that supporting the main piping array, so that both piping arrays can be more easily removed and fitted between adjacent racks and so that the auxiliary piping array slides into the rear air space when the framework is fitted.

The framework on which the pipework is supported can have a perforated strip, at the front, which open to ambient air to enable cooled air to escape and cold room air to enter between adjacent racks.

The main piping array (and/or auxiliary piping array) can include one or more pipes arranged in a parallel array between a coolant inlet and a coolant outlet. For example, the array may include parallel sections of pipe which pass vertically downwardly and then upwardly and then downwardly and so on, the upper and lower ends being joined by tubular members so that liquid coolant passes in a serpentine path along the piping array. Besides vertically arranged pipes, the pipes can be horizontal, although this would involve the use of more bends and hence would be less economic.

The piping array includes valves at the top and bottom, the bottom valves being used to fill the piping array with coolant whilst the upper valve is open to act as an air vent. The bottom valve also serves to drain the piping array, when needed. The piping array is preferably filled from the bottom to the top after being installed in the space between adjacent racks.

In the case of modular electronic units, for example, where each is of a similar predetermined size, the piping array for insertion between racks (and the auxiliary piping array for location in the rear air space) can be designed as a module for use in a modular system, whereby one or more piping arrays having a certain number of pipes of a given size can be included in the array to produce predetermined flow and return coolant temperatures having regard to the number of electronic units installed in adjacent racks and the number of electronic units in each rack. It therefore becomes possible to deal quickly and easily, and retroactively, with a problem of overheating in racks of modular units. However, the invention can be more broadly applied where electronic units are closely stacked together.

In an installation including the cooling system mentioned above, a heat extraction device can be connected to the piping arrays for supplying the coolant. For example, the heat extraction device may be a heat exchanger connected to a heat extraction device such as a air conditioning plant in a large building. This heat exchanger separates the water coolant in the cooling system from the pipework of the air conditioning system. In order to account for mains failure, an auxiliary heat extraction device is included, which is operated by an independent electrical generator, and a coolant temperature sensor is located so that if a drop in temperature is sensed, the generator is turned on so as to operate the auxiliary heat extraction device to extract heat from the coolant. This ensures that action is taken immediately, there is a predetermined rise in flow temperature. This may be, for example, only 1° C., but it is enough to trigger the operation of the auxiliary generator so that the cooling system continues to work efficiently and no excess temperature occurs which could otherwise damage the electronic units in the racks. The time taken to react to an excess temperature condition is less, where the temperature sensor is positioned to respond to return temperature, especially to a small increase in return temperature close to a heat exchanger, and hence anything causing this condition, such as failure of the main generator can be detected more quickly. Besides having a heat exchanger which is connected in the main refrigerant circuit, which normally maintains the return coolant temperature at a steady value, the auxiliary refrigerating device can include its own heat exchanger in the coolant loop.

An embodiment of the invention will now be described with reference to the accompanying schematic drawings in which:

FIG. 1e illustrates a sequential increase in air temperature across three racks;

FIG. 6 is a plan view of another rack arrangement with oppositely flowing air streams.

FIGS. 7a and 7b are plan views of modified racks; and

Figure 1A:
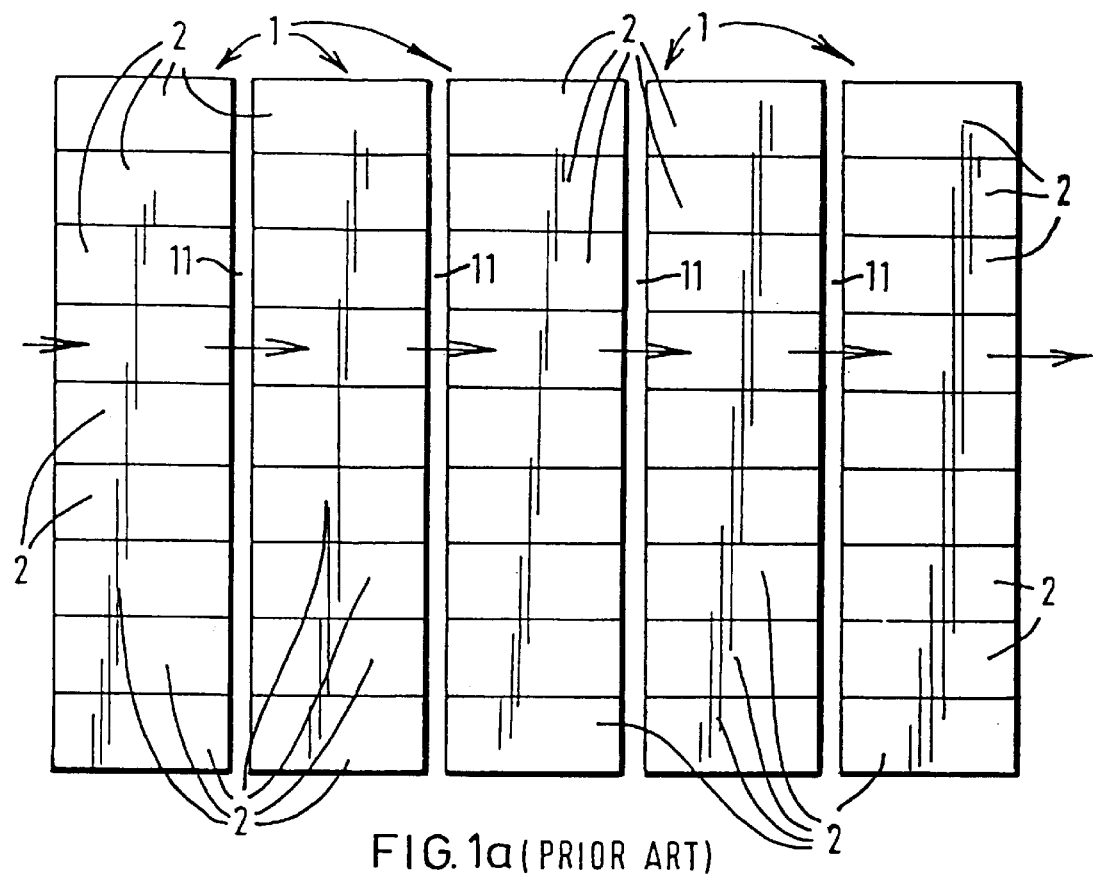
FIG. 1a is a front elevation of a prior art arrangement where electronic units are housed in adjacent racks.
Figure 1B:
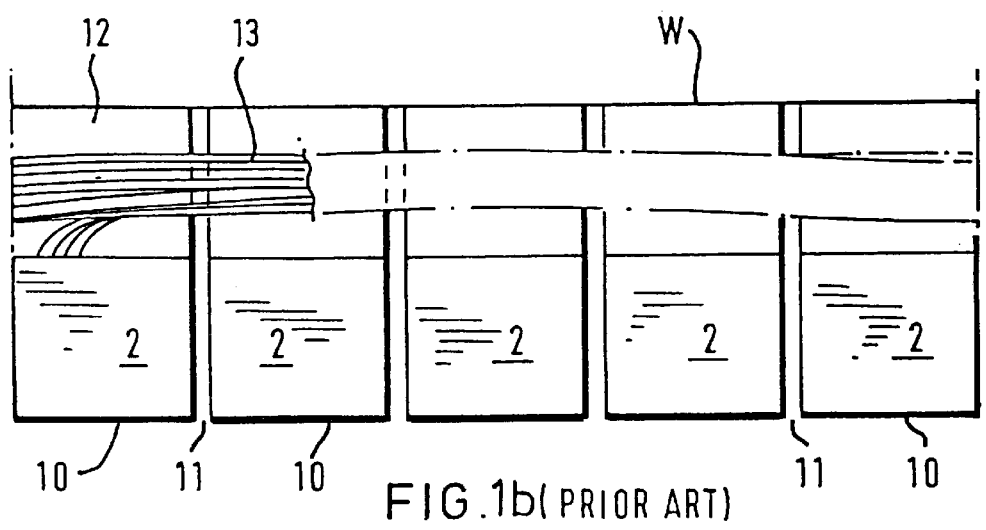
FIG. 1b is a plan view of the same prior art arrangement.

FIGS. 1a–1d illustrate a conventional installation which includes a row of racks 1 each containing a column of modular digital electronic units 2, the racks being mounted side by side with a narrow air gap 11 therebetween. The units 2 all have front panels which face outwardly and are flush with one another. The units 2 extend partly into the rack space, as shown in FIG. 1b, leaving a rear air space 12 (bounded by the walls W of the room in which the equipment is installed) which is normally occupied by cabling 13. The rear space usually extends along the width of the racks 1.

Figure 1C:
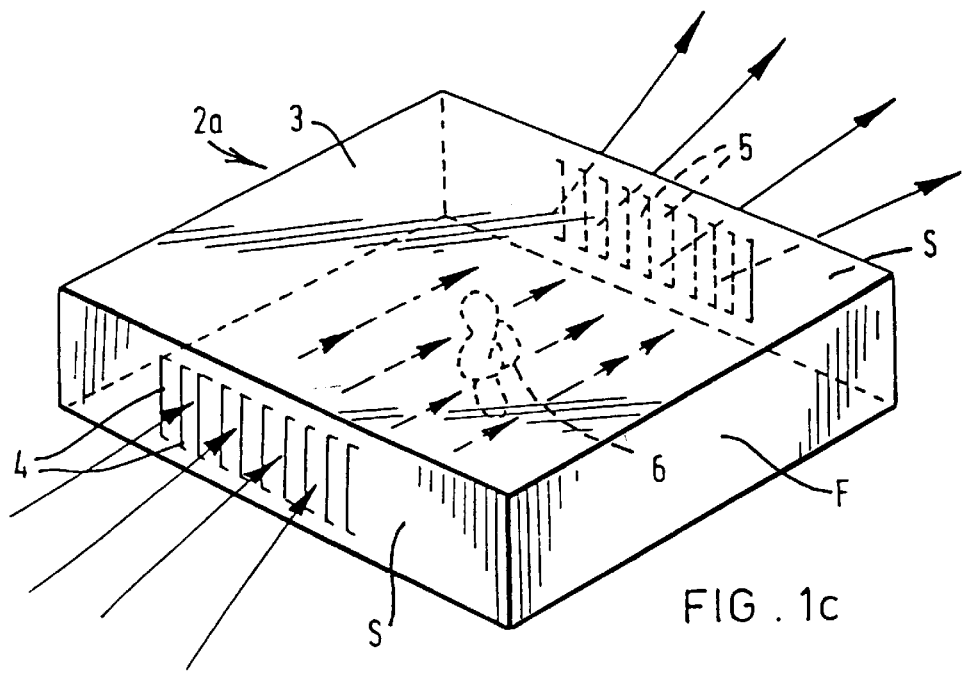
FIGS. 1c and 1d illustrate the construction of the units.
Figure 1D:
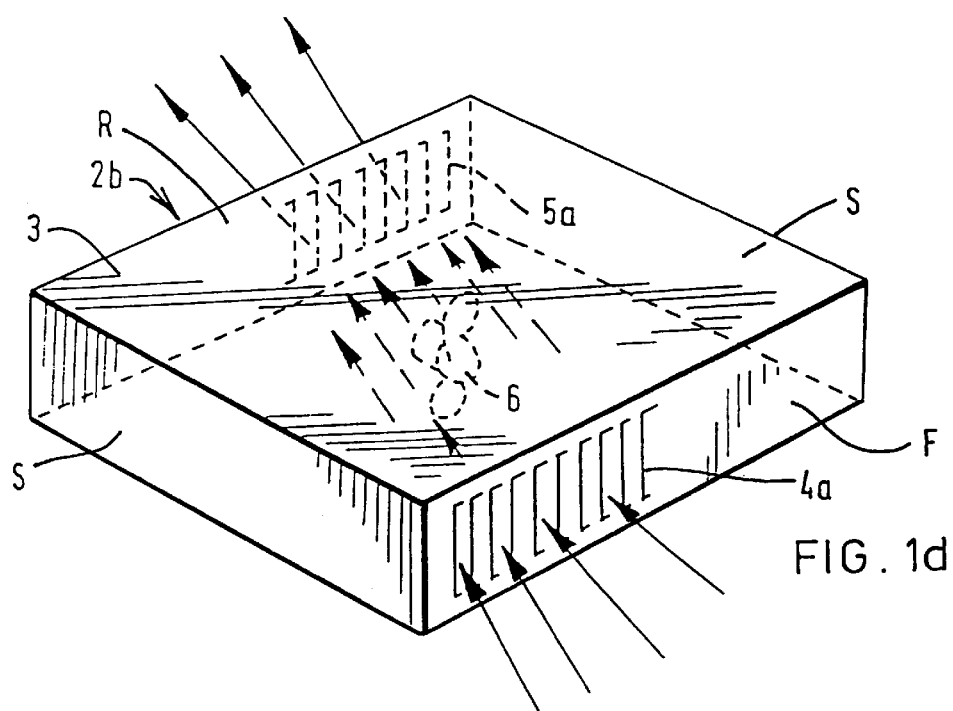

As shown in FIGS. 1c and 1d, each unit 2 includes a casing 3 having an air inlet 4,4a, an air outlet 5,5a, and a fan 6 for drawing air from the ambient into the casing 3, where it flows over the circuitry and extracts heat from the components, whereby heated air exits from the air outlets. The unit 2a shown in FIG. 1c has a side air inlet 4 and a side air outlet 5 in side panels S, whereas the unit shown in FIG. 1d has a front air inlet 4a and a rear outlet 5a in front and rear panels F and R. These individual units 2 are designed to operate efficiently with sufficiently free air space at the sides (or front and back) of the unit to avoid overheating. However, when these units are mounted in close proximity in the racks 1, so that their front panels 13 are flush (thereby providing a neat finish), overheating of the downstream units can occur, since the air gaps 11 between adjacent racks are narrow, and the units 2 (with side air inlets and outlets) are arranged at the same modular height. Therefore, air heated by components in the units 2 of an upstream rack is supplied from its air outlets 5 to the inlets 4 of the units 2 in the adjacent downstream rack. The air temperature difference across each rack 1 is therefore cumulative.

Referring to FIG. 1e, this shows the temperatures which were measured in a conventional installation with just three racks each containing a column of 10 electronic units all having side air inlets and outlets (as shown in FIG. 1c).

This Figure shows sequential increases in air temperature from rack to rack, whereby the temperature of the air leaving the final rack is about 55° C. at the top and about 34° C. at the bottom, which can cause overheating of units in the upstream racks leading to their early failure. Higher air temperatures are experienced at the top of the rack due to the tendency for heated air to rise.

Although the air space 12 is quite large compared with the narrow gaps 11 between adjacent racks, it contains much cabling and it does not assist in allowing enough cooling air to enter between the racks to avoid overheating.

Figure 2A:
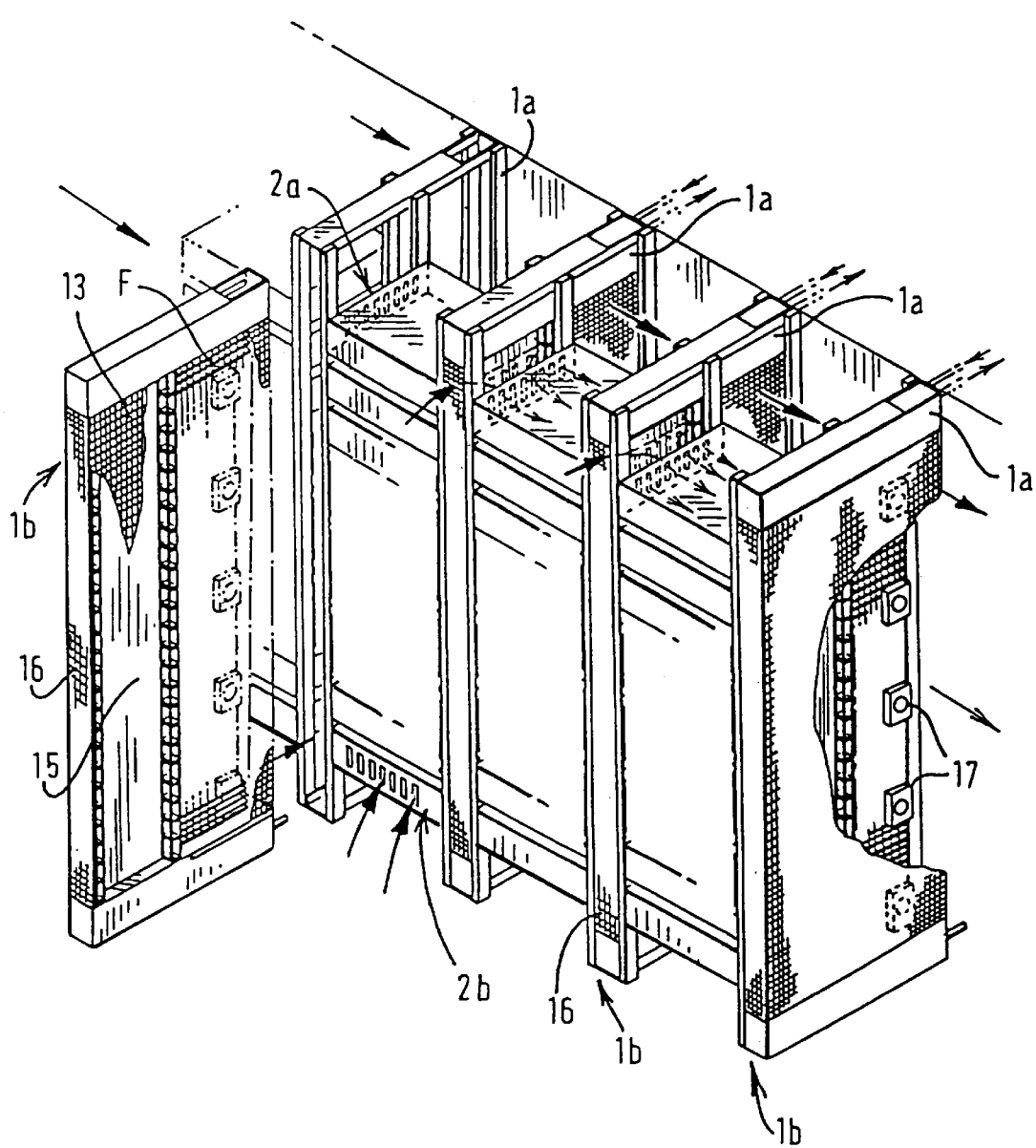
FIG. 2a is a perspective view of an installation which embodies the invention showing a framework which supports a cooling coil or piping array which is arranged to be slidably located in a gap between adjacent racks.
Figure 2B:
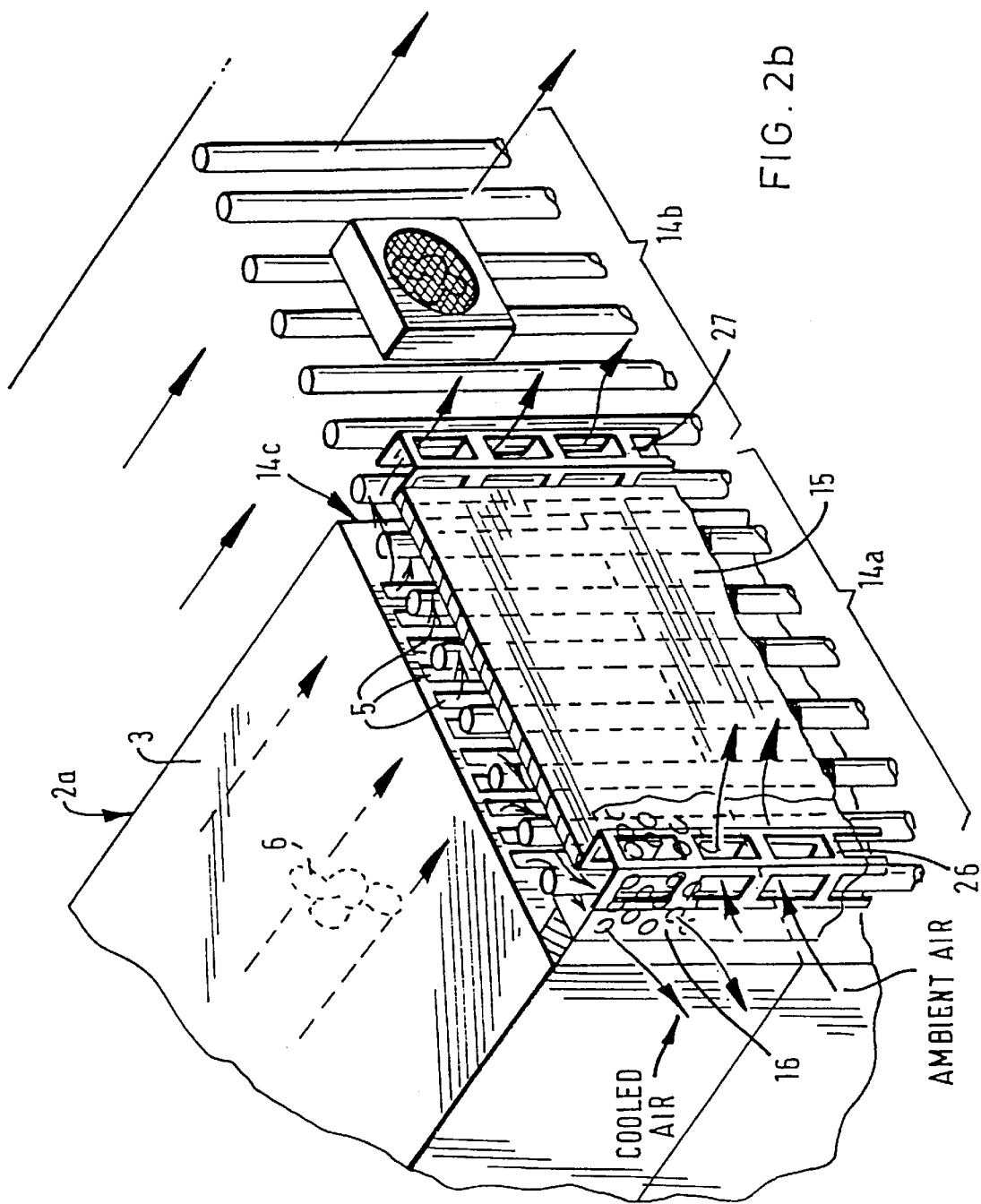
FIG. 2b shows an enlargement of a portion of the rack of FIG. 2a showing the direction of the air flow.

Referring to FIG. 2a, which shows an embodiment of the invention, similar units 2 are mounted one above the other in racks 1, the units 2 having side air inlets/outlets. The racks include locating frames 1a for receiving coil supporting frames 1b which can be slidably inserted into gap 11 defined by the locating frames 1a. The locating frames 1a also have supports (not shown in detail) for the units 2 so that they can be received, like drawers in a cabinet. The removable frame 1b supports a finned piping array P similar to that shown in FIG. 3. Piping array P has an inter-rack section 14a and a rear air space section 14b, as shown in FIG. 2b. Section 14a is not shown in FIG. 2a but it occupies a side air space 14c between a perforate sheet 13 and a baffle plate 15. FIG. 2a suggests the fins F on section 14b of this piping array. The piping array P is in two sections 14a,14b for respectively extracting heat from air flowing into the side air space 14c of gap 11. between adjacent racks, and air flowing behind the racks in the rear air space 12. For example, one unit 2b with a front air inlet and a rear air outlet is shown at the bottom of one rack.

Figure 2C:
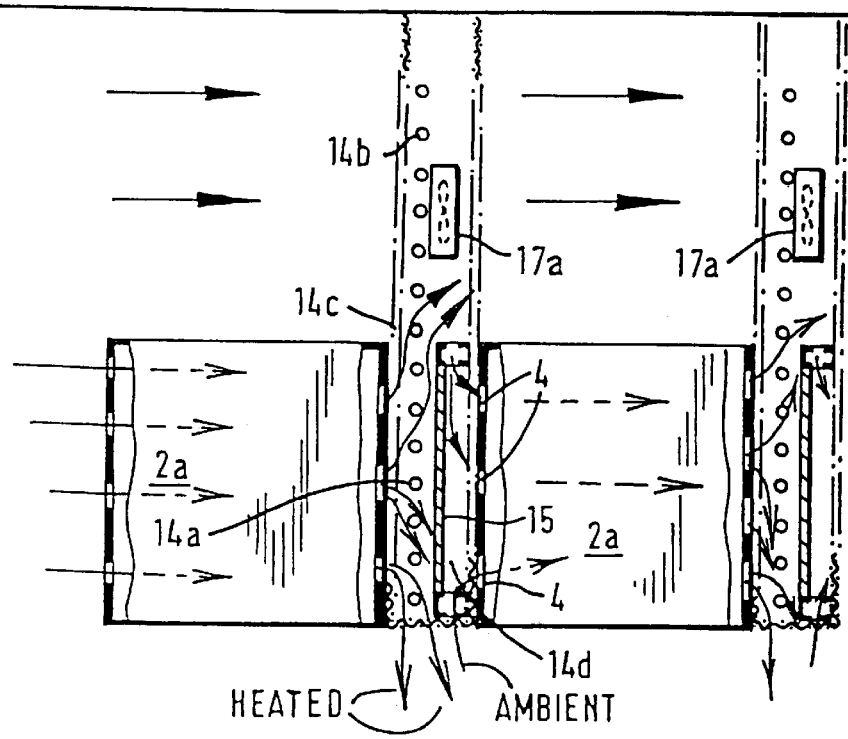
FIG. 2c is a plan view of part of the rack showing units with side to side air flow.

FIG. 2b is a perspective cut-away view and FIG. 2c is a plan view showing the flow of air in units 2a having side air inlets and outlets. Air entering the inlet of unit 2a picks up heat from the components in the casing and is then forced by the fan 6 to exit from outlet 5 where it enters a side air space 14c between unit 2a and the section 14a of the piping array. The piping array passes through a multiplicity of horizontally disposed fins (not shown in FIG. 2b), the fins being omitted from some of the drawings for greater clarity. A baffle plate 15 located behind section 14a of the piping array prevents the heated air from flowing through the gaps between the pipes and directly entering the air inlets 4 of the next adjacent unit 2a. The heated air is instead diverted by the baffle and caused to flow turbulently over the pipes of section 14a towards the sides of the baffle 15. Therefore, heat is extracted from this air, by the coolant flowing in the piping array, some of the cooled air passing out into the room through gap 11a perforate cover 16 and some passing out into the rear air space 12 the exit of side space 14c. As the baffle plate 15 creates a pressure drop in the side air space 14d (which is between the baffle 15 and the air inlets 4 of the column of units 2a in the next rack), cold air is encouraged to flow from the room into space 14d, via perforate cover 16 (at the front) and is also induced (by the fans 6 in the next units 2a) to flow into these air inlets of units 2a in the next adjacent rack. Cooled air from the rear air space 12 can also enter the side air space 14d (as indicated by FIG. 2c) and this enters the air inlets 4 of the downstream units 2a. This arrangement effectively means that the units in adjacent racks are supplied with cool air at roughly similar temperatures. This occurs in each of the gaps 11 (i.e. side air spaces) between adjacent racks along the installation.

Figure 2D:
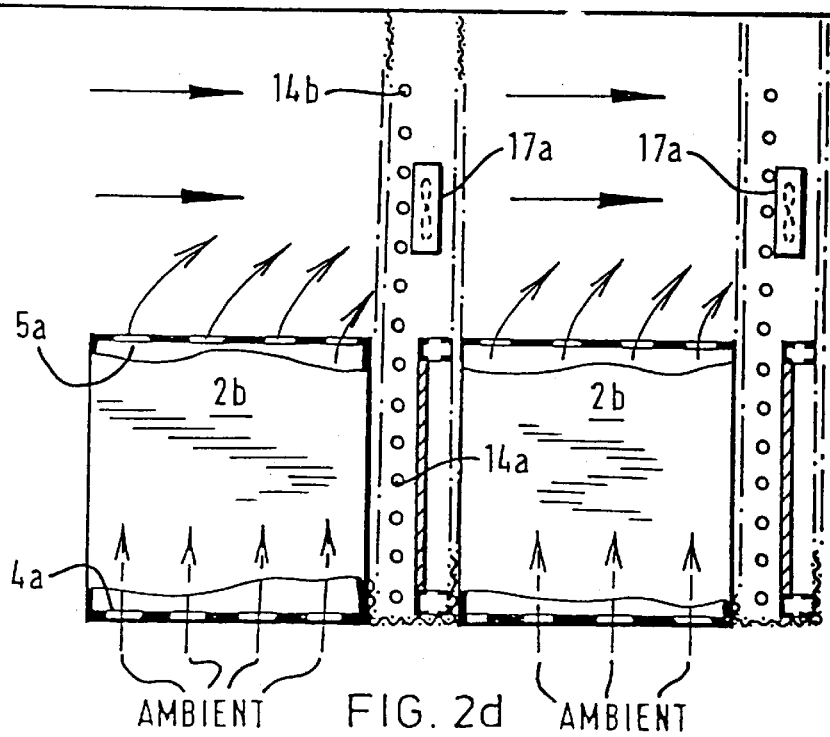
FIG. 2d is a plan view of units having a front to back air flow.

Referring to FIG. 2d, some units 2b have casings with front and rear air inlets and outlets 4a,5a whereby ambient air is drawn from the room through the front air inlets 4a, so that it then passes over the components in the casing before being forced out the rear air outlets by the fan 6. This heated air passes into the rear air space where it flows behind the units 2b and through each of the sequential sections 14b of the piping arrays. This air flow is augmented by fans 17a which are supported on brackets 17b on the section 14b of the piping array. Thus, air heated in units 2b is cooled by passage through sequential sections 14b of the piping arrays which extend rearwardly into the rear air space 12 at the back of the racks. This extracts most of the heat so that the air reaching the end of the installation is cooled almost to room temperature where it is returned into the room by the final side air space (not shown) at the end of the installation.

Thus, the piping array including sections 14a,14d, which act as a heat sink for heat which is picked up, en route, by the air induced to flow through the units 2a,2b by the fans. The net effect is to cool the heated air sufficiently so that each of the units 2 is effectively supplied with air at similar temperatures whereby there is a similar drop in air temperature across each column of units 2, but there is no cumulative effect as in the conventional installation.

Figures 3, 4:
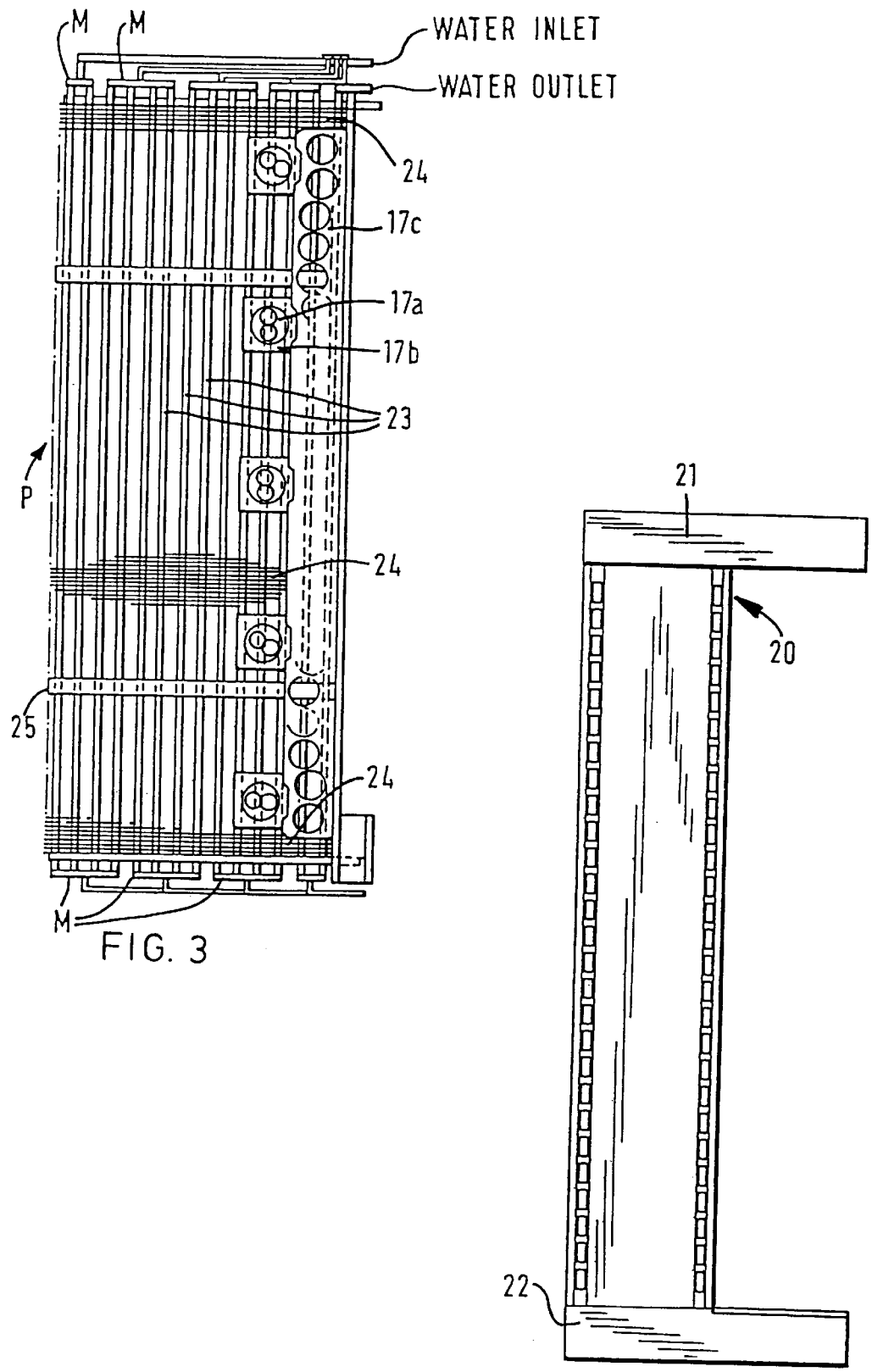
FIG. 3 shows a side elevation of the piping array in more detail.
FIG. 4 shows the framework on which the piping array is supported (in the absence of the piping array)

Referring to FIG. 4, this shows the framework 20 for the piping array, but without the piping array present. This framework consists of upper and lower box structures 21,22 for housing manifolds M connected to the top and bottom of the piping array shown in FIG. 3.

Referring to FIG. 3, the piping array includes parallel pairs of copper pipes 23 passing through a multiplicity of fins 24 extending over the whole array. These pipes conduct water downwardly and then upwardly via manifolds or connecting pipe sections M. This causes the water in the pipes to flow in a serpentine path up and down the piping array in the side space between the adjacent racks and also in the rear air space. Manifolds are shown connected to the top and bottom of parallel piping sections (but a single pair of pipes is shown on one side of the piping array in FIG. 3). The. bottom manifolds can include valves (not shown) for filling and drainage, the upper manifolds, including valves (not shown) for venting air. The piping array is preferably filled from the bottom upwards by opening the valves at the top to vent air when water enters at the bottom manifolds. The piping array can be drained from the valves in the bottom manifolds when it is necessary to remove the framework supporting the piping array for servicing.

Also is shown in FIG. 3, auxiliary fans 17a are mounted on brackets 17b which are supported on an apertured plate 17c fixed to the piping array. The plate contains a row of apertures to allow air to flow through the piping array in the vicinity of the brackets.

FIG. 3 schematically shows the fins extending transversely across the pipes of the array and these would extend across the pipes from the top to the bottom of the array. The pipes are also supported by intermediate frame members 25.

Referring to FIG. 2b, which shows an enlargement of a portion of the installation of FIG. 2a, this shows air leaving the outlet of an upstream unit which then encounters the section 14a of the piping array where it flows turbulently over the piping array (and is cooled) before leaving at the front, via perforated cover 16, and via the exit of side air space 14c. Ambient air enters via perforate cover 16 and apertured plate 26 at the front. Apertured plate 27 allows cooled air to flow into the rear air space and also back into the side air space 14d (see FIG. 2c).

Figure 5:
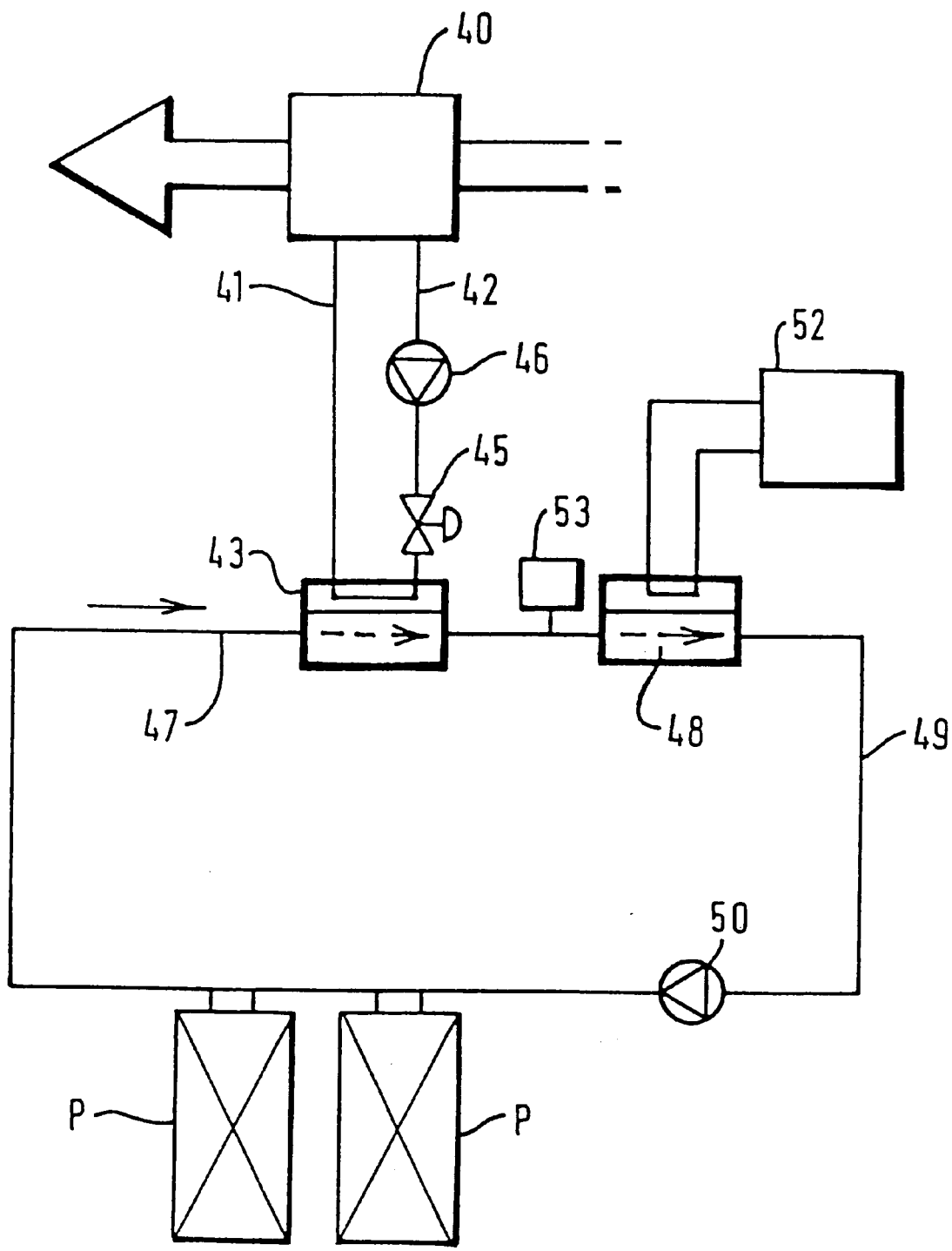
FIG. 5 is a circuit diagram showing several piping arrays connected to a coolant loop which in turn is connected to main and auxiliary refrigeration units.

Referring to FIG. 5, this shows a system for supplying coolant (i.e. water) to each of the piping arrays which are mounted between adjacent racks. A main refrigeration system 40, (which can be part of the plant in the building that is connected to air conditioning equipment) has flow and return pipes 41,42 connected to a primary heat exchanger 43. Chilled coolant therefore flows in the primary loop from the main system 40 through pipe 41 to one side of the heat exchanger 43 before being returned by pipe 42. Pipe 42 includes a control valve 45 and pump 46. The heat exchanger 43 separates the coolant in the main refrigeration system from a secondary loop containing water which is used as the coolant in the piping arrays P. This secondary loop includes flow pipe 47 connected to the water containing side of a heat exchanger 48 and a return pipe 49 which returns chilled water, via pump 50, to the manifolds connected to the piping arrays P. It is a comparatively simple task to connect heat exchanger 47 to the main refrigeration system for maintaining a constant supply of chilled water with a flow temperature of say 14° C. This chilled water extracts heat from the heated air flowing over the piping arrays P so that the return temperature rises to about 17° C.

It will be understood by those skilled in the art that the secondary loop containing heat exchangers 43,48; pipes 47,49; and piping arrays P; will have a certain fluidic resistance; and that pump 50 will produce a certain fluidic pressure, whereby the fluid flow rate is determined. Thus, a modular system can be designed using pipes of certain diameters, lengths and configurations (e.g. bends); at required temperatures and flow rates in the primary and secondary loops.

In order to prevent overheating of the rack mounted units in the event of an electrical power failure of the main refrigeration system 40, a standby generator and auxiliary refrigeration system 52 is connected to heat exchanger 53 in the pipe 49. This auxiliary generator 52 is automatically switched on in response to an output from temperature sensor 53 which detects the temperature of the flow. For example, this temperature sensor can be responsive enough to cause the auxiliary generator 52 to be turned on if the flow temperature rises by only 1° C. above say 14° C. Thus, if the main refrigeration system 40 should fail through a power cut or a fault, or if there is any reason for the flow temperature to rise higher than usual (perhaps on a hot day), the auxiliary generator 52 will be started in order to maintain the flow of chilled water at the correct temperature. Whilst the electronic units 1 would also be cut off from an electrical supply which failed, they would retain heat for some time and hence require further cooling until power supplies were restored.

Whilst the preferred embodiment of the invention addresses the problem of avoiding cumulative temperature rises from rack to rack, with electronic units having side air inlets and outlets (whereby the cooling air flows in the same direction), the direction of air flow through an electronic unit may not always be the same. For example, an installation may involve fitting electronic units made by different manufacturers, some of which have side air inlets/outlets with left to right air flow, others having side air inlets/outlets with right to left air flow, and further units which have front to back air flow. These need to be accommodated on adjacent racks in the same room. Thus, there may be a situation where a column of electronic units in one rack have their air outlets having the air outlets of a column of units in an adjacent rack, whereby heated air flows in opposite directions into the intermediate space between the racks. This problem can be dealt with by installing a piping array in the intermediate space, without using any baffles, since the colliding air flows will cause much more turbulence than usual hence causing a greater thermal exchange with the coolant flowing through the piping array. This is schematically illustrated by FIG. 6 which is a plan view of one level of rack mounted units 2*a,* mounted at the same modular height, with side air inlets and outlets (not shown) that cause air flow in opposite directions (shown by the arrows in the units) and colliding air streams in the vicinity of piping array 14. This may include the intermediate rack section 14*a* and the rear air space section 14*b* as shown in FIG. 2*b.* FIG. 6 also shows fan F which is located in the rear piping section. In FIG. 6, ambient air enters in alternate gaps and, after cooling, is returned from piping arrays in alternate gaps. Some of the cooled air flows into the rear air space and is drawn along the back by fan F.

FIG. 7*a* is a similar plan view of two side by side electronic units with side air inlets and air flow in the same direction and including piping array 14 and baffle plate 15. In this case, a rear panel 60 of the rack arrangement is pivotally mounted (at 61) so as to provide access to the rear air space and the rear of units 2*a.* This provides the facility for further modification, as shown in the plan view of FIG. 7*b,* where the removably mounted rear panel 60 has been replaced by a piping array 14*x* and Fan F for drawing air therethrough into the space behind the rack, i.e. into the room in which the equipment is installed. In this case, the electronic units 2*b* are of the type where air flows through a front air inlet, out through a rear air outlet and into the rear air space.

Figure 8:
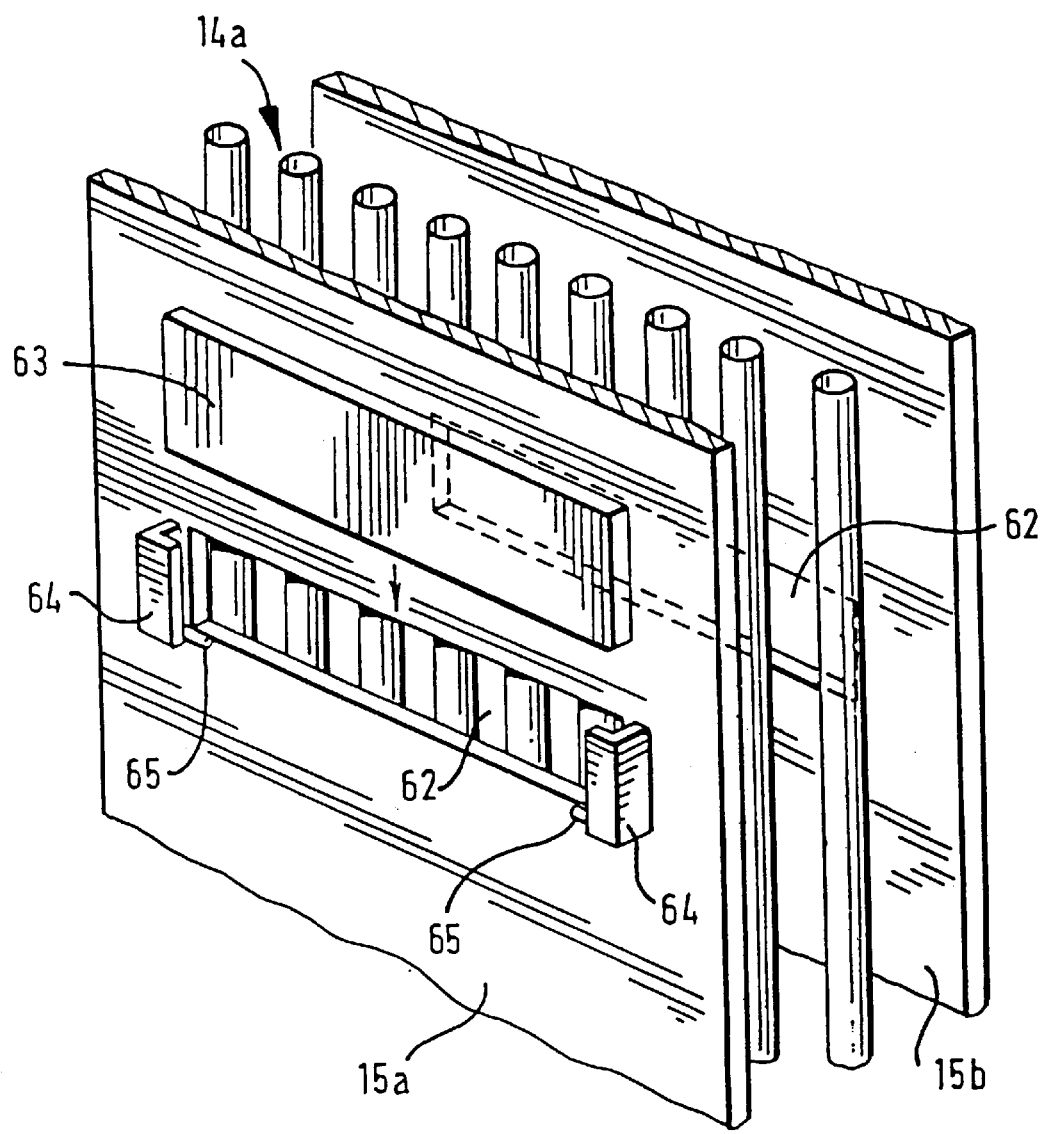
FIG. 8 is a perspective view of a modified baffle arrangement.

With regard to the problem of dealing with opposite streams of air, as illustrated in FIG. 6, a further modification is shown in FIG. 8 which can be used to alter the configuration of the baffle 15. In FIG. 8, two baffle plates 15*a,*15*b* are used together with an intermediate piping section 14*a.* Each plate 15*a,*15*b* includes a rectangular cutout 62 (at the level of the air outlet 5 of the respective electronic unit 2*a,* not shown), which can be covered by a slidable plate 63 which can be slid into guides 64, one on each side of cutout 62. The plate 63 is shown (artificially) above the cutout 62 in FIG. 8, because it would either be dropped into place, where it abuts the stops 65 and then closes the aperture 62, or not used. For example, in the case of adjacent units with side air inlets/outlets, the closure plate 63 would be removed on the side of the piping section 14*a* which receives heated air from the outlet 5 of the unit 2*a* in the upstream rack. The baffle downstream of the piping section 14*a* would have the closure plate 63 in place. The positions of the plates 63 would be reversed when the air flow is in the opposite direction, i.e. with similar electronic units having side air inlets/outlets, but air flowing in the opposite direction. However, in the case of adjacent units where the air flow is in opposite directions (as in FIG. 6), both closure plate 63 would be removed. Therefore, the baffle arrangement shown in FIG. 8 can be made to accommodate different arrangements of electronic units in the racks, depending on the direction of air flow.

Whereas the baffle plate 15 can include various apertures and openable plates, it may also be configured like a venetian blind, whereby either the whole area of the blind, or sections of it, can be opened or closed to give the required air flow characteristics.

What is claimed is:

1. A cooling system for electronic units mounted in racks, each of said units having a casing with an air inlet, an air outlet and a device for inducing a flow of ambient air from the inlet to the outlet to cool the contents of the electronic unit;

the cooling system comprising at least one chiller unit for location between adjacent upstream and downstream racks, the chiller unit having means for connection to a heat extraction device so that when the chiller unit receives air heated in transit through one or more units in an upstream rack, heat is removed from the air by the chiller unit before it is returned to ambient.

2. A cooling system according to claim 1, wherein the chiller unit is provided for location between adjacent racks on which the electronic units are mounted for unidirectional flow of cooling air between upstream and downstream racks; cooled air from the intermediate chiller unit being either returned to the ambient or flowing into the air inlets of an electronic unit in a downstream rack.

3. A cooling system according to claim 1, wherein the chiller unit is provided for location between opposite racks on which electronic units are mounted for opposite flows of cooling air between the upstream and downstream racks, whereby cooled air from both upstream and downstream racks is returned to ambient.

4. A cooling system according to claim 1, wherein the chiller unit comprises a piping array having at least a section for installation in a gap between the adjacent racks.

5. A system according to claim 4, wherein the piping array includes a pipe or pipes which conduct coolant on a continuous serpentine path.

6. A system according to claim 1, further including a baffle for diverting the heated airstream which exits from the air outlets of the units in the upstream rack in order to increase the transfer of heat to the chiller unit.

7. A system according to claim 6, wherein the baffle backs the chiller unit so that heated air, which exits from the air outlets of the upstream units, is diverted to one or both sides of the chiller unit, so that it flows across the chiller unit and is cooled before being directed away from the racks.

8. A system according to claim 6, wherein the baffle is a plate arranged after the chiller unit (with respect to the direction of the heated airstream), and the baffle is flanked by one or more apertured members which allow cooled air to escape to ambient away from the racks.

9. A system according to claim 6, wherein the electronic units are mounted for unidirectional flow of air in adjacent racks and the baffle is dimensioned and positioned so as to create a pressure difference between an upstream space which receives the heated airstream, and a downstream space between the baffle and the air inlets of the units in the next adjacent rack, so that the air pressure in the downstream space is lower than that in the upstream space, whereby the cooled air leaving the chiller unit is directed away from the racks after passing over the chiller unit and ambient air is drawn into the downstream air space.

10. A system according to claim 1, further including a baffle arrangement having closable apertures for adjusting the flow of air from the air outlet of the electronic unit in the upstream rack.

11. A system according to claim 1, including a framework for supporting the chiller unit, which framework is dimensioned for insertion between adjacent racks.

12. A system according to claim 2, including means for creating reduced air pressure in a gap downstream of the chiller unit so as to encourage ambient and/or cooled air to flow from the gap into the air inlets of downstream electronic units.

13. A system according to claim 1, wherein the cooling system further includes an auxiliary chiller unit which extends rearwardly of the racks so as to communicate with rear air spaces behind the racks and thereby cool heated air flowing in the rear air spaces, the auxiliary chiller unit being either an extension of the intermediate chiller unit, or separate therefrom.

14. A system according to claim 13, wherein the auxiliary chiller unit comprises an auxiliary piping array.

15. A system according to claim 14, further including means for inducing a flow of air through the auxiliary chiller unit.

16. A system according to claim 1, wherein said chiller unit is mounted on a framework which is removable from the space between adjacent racks, the framework further including friction reducing means to facilitate slidably locating the framework between adjacent racks.

17. A system according to claim 1, including a main piping array and an auxiliary piping array mounted on a framework which is removable from the space between adjacent racks, for respectively extracting heat from air spaces between adjacent racks and rear air spaces at the rear of the racks.

18. A system according to claim 17, wherein the piping arrays (including any auxiliary piping arrays) each include one or more pipes arranged in a parallel array between a coolant inlet and a coolant outlet.

19. A system according to claim 18, wherein the piping arrays include parallel sections of pipe which pass vertically downwardly and then upwardly and are joined by tubular members at the top and bottom of the array.

20. A system according to claim 17, wherein the piping arrays include valves at the bottom and top of the array, the bottom valves being used to fill the piping arrays with coolant whilst the upper valve acts as an air vent, the bottom valve also serving to drain the piping arrays, when needed.

21. A system according to claim 1, wherein each chiller unit (and auxiliary chiller unit if included) is a module in a modular system for cooling units of a modular size in the racks, whereby one or more chiller modules can be included to produce predetermined flow and return temperatures in the coolant with regard to the number of electronic units installed in adjacent racks and the number of racks.

22. An installation including the electronic equipment and cooling system according to claim 1 and further comprising a heat extraction device to which the chiller units are connected for supplying the coolant.

23. An installation according to claim 22, wherein the coolant is chilled water.

24. An installation according to claim 23, which includes an auxiliary heat extraction device, the auxiliary device being operated by an independent electrical generator, and further including a temperature sensor located so as to respond to coolant temperature in the chiller unit, and a switch responsive to an output from the sensor for starting the generator in order to extract heat from the coolant if the coolant temperature exceeds a predetermined value due to failure of the main heat extraction device.

25. An installation according to claim 21, wherein the casing of each electronic unit has a front panel behind which the unit extends into the rack, and wherein the air inlets and outlets are located at opposite sides of the electronic unit, whereby air flows transversely across the unit to cool its contents and then onto the chiller unit.

26. An installation according to claim 25, wherein the chiller unit is supported in structure which defines an air space on the downstream air side communicating with air inlets of the units in the next rack.

27. An installation according to claim 22, wherein the casing of each electronic unit has front and back panels which are positioned at the front and the back of the associated rack space, the air inlets and outlets of the latter electronic units being located in the front and back panels, so that air flows from the front to the back of the electronic unit to cool its contents, the electronic units being mounted in the rack so that a rear air space is provided, at the rear of the unit in the rack, the rear air space communicating with the auxiliary chiller units.

28. An installation according to claim 22, wherein the rear of one or more racks is closed by a removable panel either to provide access to the rear of the electronic units or to define a rear chiller unit.

* * * * *

UNITED STATES PATENT AND TRADEMARK OFFICE
CERTIFICATE OF CORRECTION

PATENT NO.      : 6,305,180 B1
DATED           : October 23, 2001
INVENTOR(S)     : David Jonathan Miller et al.

It is certified that error appears in the above-identified patent and that said Letters Patent is hereby corrected as shown below:

<u>Title page,</u>
Item [73], Assignees, should read:
-- **British Broadcasting Corporation
London: Trox (UK) Limited**, Norfolk,
both of (GB) --

Signed and Sealed this

Twenty-sixth Day of November, 2002

*Attest:*

*Attesting Officer*

JAMES E. ROGAN
*Director of the United States Patent and Trademark Office*